(12) United States Patent
Caffee et al.

(10) Patent No.: US 7,262,621 B1
(45) Date of Patent: Aug. 28, 2007

(54) METHOD AND APPARATUS FOR INTEGRATED MIXED-SIGNAL OR ANALOG TESTING

(75) Inventors: Aaron Joseph Caffee, Hillsboro, OR (US); Christopher Scott Jones, Portland, OR (US); Robert Beverly Lefferts, Portland, OR (US); Ross Andrew Segelken, Portland, OR (US); Jeffrey Lee Sonntag, Portland, OR (US); Daniel Keith Weinlader, Allentown, PA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 11/084,947

(22) Filed: Mar. 21, 2005

(51) Int. Cl.
*G01R 31/26* (2006.01)
(52) U.S. Cl. ..................... 324/763; 324/765
(58) Field of Classification Search ............. None See application file for complete search history.

(56) References Cited

U.S. PATENT DOCUMENTS

| 6,202,183 | B1 * | 3/2001 | Ginetti et al. ............ 714/726 |
| 7,148,676 | B2 * | 12/2006 | Kamano et al. ......... 324/158.1 |
| 2003/0154047 | A1 * | 8/2003 | Chun et al. .............. 702/118 |

* cited by examiner

*Primary Examiner*—Minh N. Tang
(74) *Attorney, Agent, or Firm*—Park, Vaughan & Fleming LLP

(57) ABSTRACT

A functional block under test (FBUT), comprising mixed-signal or analog circuits, can be tested by a digital test machine (DTM). A DTM sources test vectors to, and expects to receive certain vectors back from, a DUT. The DUT is a single, physically contiguous, IC upon which is integrated the FBUT, a mixed-signal generate and capture unit (MSGC) and a control system. The test vectors can include computer programs for instructing the control system on how to perform mixed-signal or analog-domain tests of the FBUT using resources of the MSGC (such as DACs and ADCs). The test vectors can also include data that effects the operation of a parameterized test procedure, where the test procedure is part of the control system. The control system, in accordance with the test procedure, uses the MSGC to perform mixed-signal or analog-domain tests of the FBUT. The FBUT can include an analog test bus.

12 Claims, 10 Drawing Sheets

METHOD AND APPARATUS FOR INTEGRATED MIXED-SIGNAL OR ANALOG TESTING

FIELD OF THE INVENTION

The present invention relates to techniques for testing an integrated circuit (IC) device under test (DUT), and more particularly to techniques for testing mixed-signal (MS) or analog DUTs.

BACKGROUND OF THE INVENTION

The prior art comprises two types of IC test machines (IC TMs): digital test machines (DTMs) and MS test machines (MSTMs).

DTMs are used to test digital DUTs, such as ASICs, while MSTMs can be used for testing MS DUTs.

A DTM can source test vectors to a DUT. Each vector represents a set, or word, of digital values. A test vector specifies values for digital output lines of a DTM that can drive or stimulate a DUT. A DTM can also determine whether the outputs of a DUT are an exact match for an expected set of vectors. Each test or expected vector can typically range anywhere from 1 to 200 bits in width. Outputs of the DUT can generally only be compared to the expected vectors to determine whether the DUT is working correctly. The expected vectors can be generated from the same software used for generating the test vectors.

An MSTM differs from a DTM in several ways. Like a DTM, an MSTM has resources for stimulating a DUT with digital test signals. In addition, an MSTM can also comprise resources, such as DACs, that can produce analog domain stimulus signals. Like a DTM, an MSTM can read or capture outputs of a DUT in the digital domain. In addition, an MSTM can also comprise resources, such as ADCs, that are intended to measure analog domain output signals. Such measurements can be combined to produce a digital representation of an analog waveform. Before a digital representation of an analog waveform can be compared against expected values, it can be necessary for the MSTM to perform digital signal processing (DSP) upon such digital representation. For example, the MSTM can perform a Fast Fourier Transform (FFT).

Because an MSTM often needs to produce and/or process relatively complex digital representations of analog waveforms, it typically includes a general purpose computer (e.g., a microprocessor system) that can be appropriately programmed.

The programming of an MSTM can be complex, causing significant delays in time-to-market for MS ICs. Furthermore, the programming of an MSTM can be non-portable, since it can depend upon the particular hardware resources of the MSTM for which it was written.

In contrast, the test and expected vectors, used in a DTM, can be relatively portable since they can depend only on the resources of the digital DUT. It would be desirable to accomplish MS DUT testing with test and expected vectors possessing a similar level of portability to those of digital DUT testing.

SUMMARY OF THE INVENTION

Please refer to the Glossary of Selected Terms, included at the end of the Detailed Description, for the definition of selected terms used in the below Summary.

The present invention permits MA DUTs to be tested by DTMs, where the DTM sources and expects portable vectors.

A DTM 111 sources test vectors 120 to an MA DUT 110. A DTM can also compare MA DUT outputs 112 to expected vectors 121.

Test vectors 120 can differ from known test vectors by including program test procedures that instruct MA DUT 110 on how to perform mixed-signal or analog-domain tests of the FBUT and can convert the results of such tests into the domain of digital data. Once such a program test procedure has performed a mixed-signal or analog domain test of the FBUT, MA DUT outputs 112 can contain digital domain representations of the results of the mixed-signal or analog domain tests (e.g., MA DUT outputs 112 can contain pass/fail results). Since DTM 111 only needs to source and compare digital data, a standard DTM can be used for MA DUT testing, when performed according to the teachings of the present invention.

Test vectors 120 can also differ from known DTM test vectors by including data that parameterizes the operation of a test procedure for performing mixed-signal or analog-domain tests of the FBUT, where the test procedure is located on MA DUT 110. The test procedure can be on MA DUT 110 in the form of a program test procedure or dedicated test procedure.

An MA DUT 110 can be further comprised of the following sub-systems, all of which can be integrated on the same physically contiguous IC: an FBUT 212 that can include an ATB 213, a control system 210 and an MSGC 211.

DTM 111 communicates with control system 210. Control system 210 controls MSGC 211 in order to perform mixed-signal or analog-domain tests of FBUT 212. Control system 210 may also need to control an ATB 213 in order to perform mixed-signal or analog-domain tests of FBUT 212.

Control system 210 can be any general purpose computing system. Alternatively, or as an addition, control system 210 can be (in whole or in part) a computing system, organized for performing dedicated test procedures that conduct mixed-signal or analog-domain tests of the FBUT.

MSGC 211 can contain one or more DACs that can apply analog-domain signals to FBUT 212 over force lines 220. MSGC 211 can also contain one or more ADCs that can measure analog-domain signals from FBUT 212 over sense lines 221. Control system 210 can exchange control and data signals, with FBUT 212 and MSGC 211 via a bus 310.

Signals applied to force lines 220 can be coupled to appropriate nodes of FBUT 212. Such signals can be adjustably routed, to appropriate nodes of FBUT 212, if FBUT 212 includes an ATB 213. Signals from nodes of FBUT 212 can be coupled to sense lines 221. Such signals can be adjustably routed, to sense lines 221, if FBUT 212 includes an ATB 213. Routing by ATB 213 can be controlled by transmission gates. The transmission gates can be controlled by a TG control register 390, where register 390 can loaded by control system 210 via bus 310.

An example FBUT 212, ATB 213 and MSGC 211 are presented.

If FBUT 212 is an Si IP core, then ATB 213, control system 210 and MSGC 211 can be included, as a package, with such core. The package is a self-testable unit that can be tested with the same digital test vectors 120, by a DTM, regardless of the particular end-use of the IC in which the package is included.

While the incorporation of an ATB into an FBUT has advantages for testing purposes, care must be taken, in the design of the ATB, to insure the ATB does not significantly effect the intended operation of the FBUT. One issue that needs to be addressed in ATB design is isolation. An ATB is effectively linking together nodes of the FBUT that are ordinarily disconnected, except that the ATB's TGs are intended to preserve the isolation of such nodes.

Multiple FBUTs can be tested by a single control system and MSGC. This can occur, for example, where the FBUT is an instance of an Si IP core. If the Si IP core is an interface circuit, for example, it can be desirable to produce multiple instances of such core on an MA DUT.

Two examples are presented, of the operation of a DTM when used to test an MA DUT constructed in accordance with the principles of the present invention. In a first example, the DTM loads an program test procedure into the memory of a control system 210 of an MA DUT 110. In a second example, the DTM loads parameters into the memory of a control system 210 of an MA DUT 110, where control system 210 contains at least one dedicated test procedure.

An example program test procedure is presented, whose digital representation can be loaded into the memory of a control system 210.

An example dedicated test procedure is presented, whose digitally represented parameters can be loaded into the memory of a control system 210.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 7A depicts a flow chart for an example program test procedure while

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

Please refer to the Glossary of Selected Terms, included at the end of this Detailed Description, for the definition of certain selected terms used below.

TABLE OF CONTENTS TO DETAILED DESCRIPTION

1. Overview
2. Further Details
   2.1.1. Portability
   2.1.2. Isolation
   2.1.3. Multiple FBUTs
   2.1.4. Example DTM Operation
   2.1.5. Example Program Test Procedure
   2.1.6. Example Dedicated Test Procedure
3. Concise Formulations of The Invention
4. Glossary of Selected Terms

1. Overview

Figure 1:
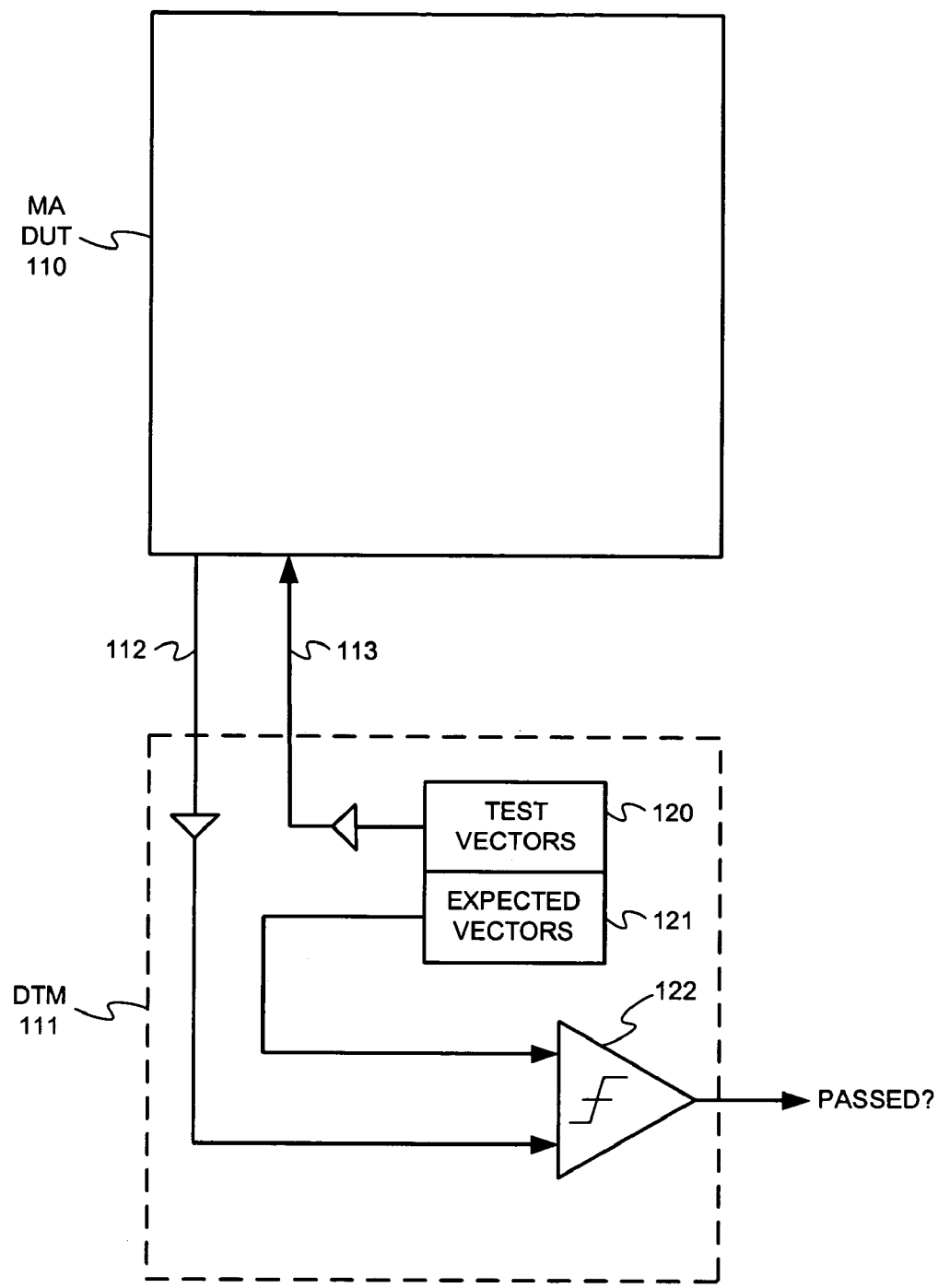
FIG. 1 presents an overview of the type of testing environment that can be used with the present invention.

The present invention permits MA DUTs to be tested by DTMs, where the DTMs source and expect portable vectors. FIG. 1 presents an overview of the type of testing environment that can be utilized.

While the present invention is described mainly in conjunction with a DTM, any TM, that possesses the capabilities discussed herein, can be used.

A DTM 111 sources test vectors 120 to an MA DUT 110, and compares outputs 112 to a set of expected vectors 121. Test vectors 120 are sourced via bus 113, while bus 112 represents outputs to be compared to expected vectors 121 by comparator 122. A set of expected vectors can be comprised of elements each capable of at least three values. For example, each expected vector element can assume one of the following three values: expected high, expected low, no expectation. Comparator 122 produces a "passed" result only when all elements, of all expected vectors which had an expectation, matched the outputs present on bus 112.

In known uses of a DTM, test vectors 120 are data that directly stimulate a digital DUT. As will be explained further below, test vectors 120 can differ from such known test vectors by including program test procedures that instruct MA DUT 110 on how to perform mixed-signal or analog-domain tests of an FBUT integrated on MA DUT 110. Such program test procedures can further instruct MA DUT 110 on how to convert the results of mixed-signal or analog-domain tests into the domain of digital data. Once such a program test procedure has performed a mixed signal or analog domain test of an FBUT, MA DUT outputs 112 can contain digital domain representations of the results of the mixed-signal or analog domain tests (e.g., MA DUT outputs 112 can contain pass/fail results). Since DTM 111 only needs to source and compare digital data, a standard DTM can be used for MA DUT testing, when performed according to the teachings of the present invention.

As will be explained further below, test vectors 120 can also differ from known DTM test vectors by including data that parameterizes the operation of a test procedure for performing mixed-signal or analog-domain tests of an FBUT, here the test procedure is located on MA DUT 110. The test procedure can be on MA DUT 110 in the form of a program test procedure, or it can be a dedicated test procedure. As with the case of loading (or receiving) a program test procedure through test vectors 120, once the test procedure has performed a mixed-signal or analog domain test of an FBUT, MA DUT outputs 112 can contain digital domain representations of the results of the mixed-signal or analog domain tests.

Test vectors 120 can comprise both program test procedures and data that parameterizes operation of a test procedure. A program test procedure can be loaded onto an MA DUT 110, through test vectors 120, and such resident test procedure can be executed in accordance with data, also included in test vectors 120, that parameterizes operation of the test procedure.

Figure 2:
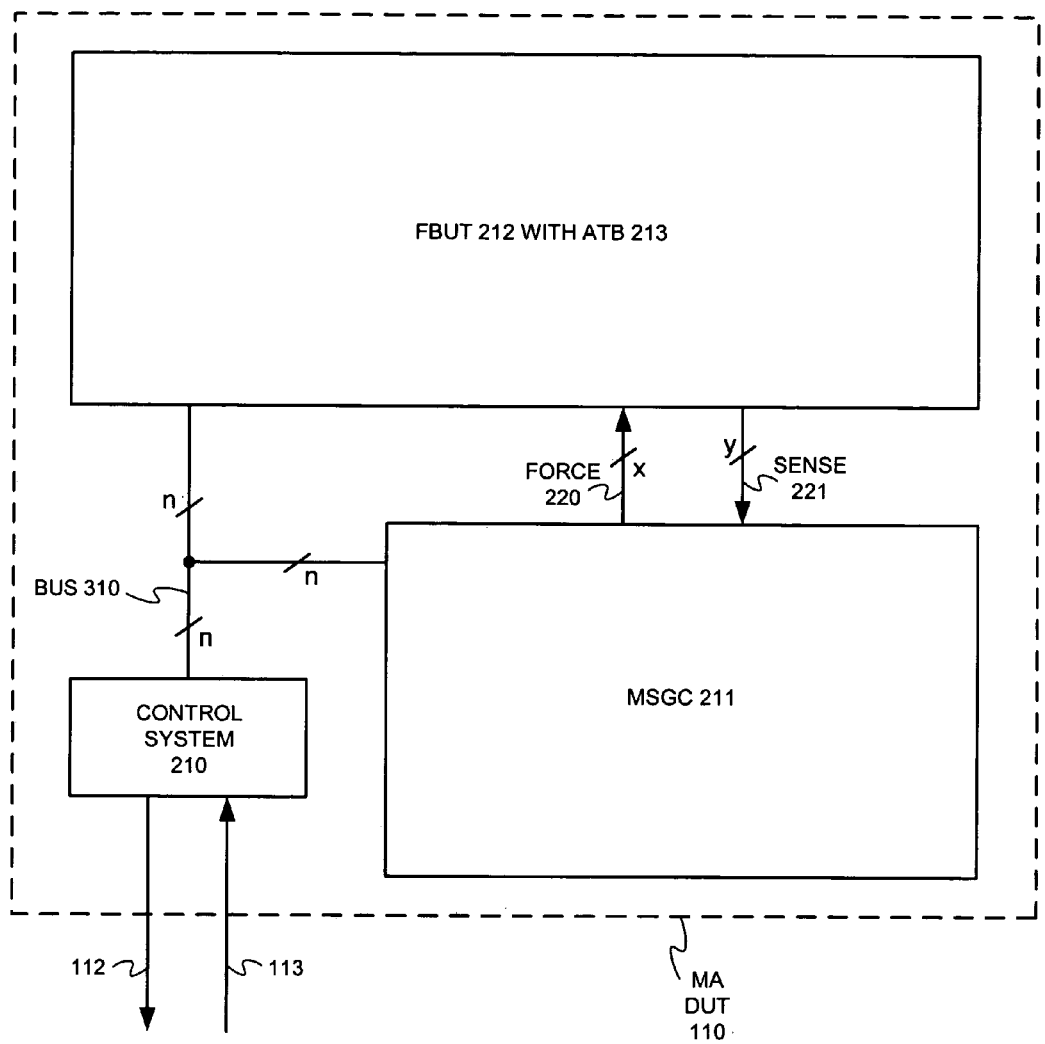
FIG. 2 presents an internal organization for an MA DUT 110.

FIG. 2 presents an internal organization of MA DUT 110 for accomplishing the above-described operation of FIG. 1. MA DUT 110 is further comprised of the following subsystems, all of which can be integrated on the same physically contiguous IC: an FBUT 212 that can include an ATB 213, a control system 210 and an MSGC 211.

For purposes of example, FBUT 212 can be an instance of an Si IP "core." DTM 111 communicates with control system 210. Control system 210 controls MSGC 211 in order to perform mixed-signal or analog-domain tests of FBUT 212. Control system 210 may also need to control an ATB 213 in order to perform mixed-signal or analog-domain tests of FBUT 212.

Control system 210 can be any general purpose computing system. In this case, test vectors 120 can include program test procedures that instruct MA DUT 110 on how to perform mixed-signal or analog-domain tests of the FBUT. Alternatively, or as an addition, control system 210 can be (in whole or in part) a dedicated computing system, organized for performing dedicated test procedures that conduct mixed-signal or analog-domain tests of the FBUT. In this case, test vectors 120 can still include data that parameterizes the operation of such dedicated test procedures.

Control system 210 receives from DTM 111, either through test vectors 120 or otherwise, a signal to start execution of one or more of its test procedures.

MSGC 211 can contain one or more DACs that can apply analog-domain signals to FBUT 212 over force lines 220. MSGC 211 can also contain one or more ADCs that can measure analog-domain signals from FBUT 212 over sense lines 221. Control system 210 can exchange control and data signals, with FBUT 212 and MSGC 211 via a bus 310. Bus 310 is shown in FIG. 2 as being "n" bits wide.

Figure 3A:
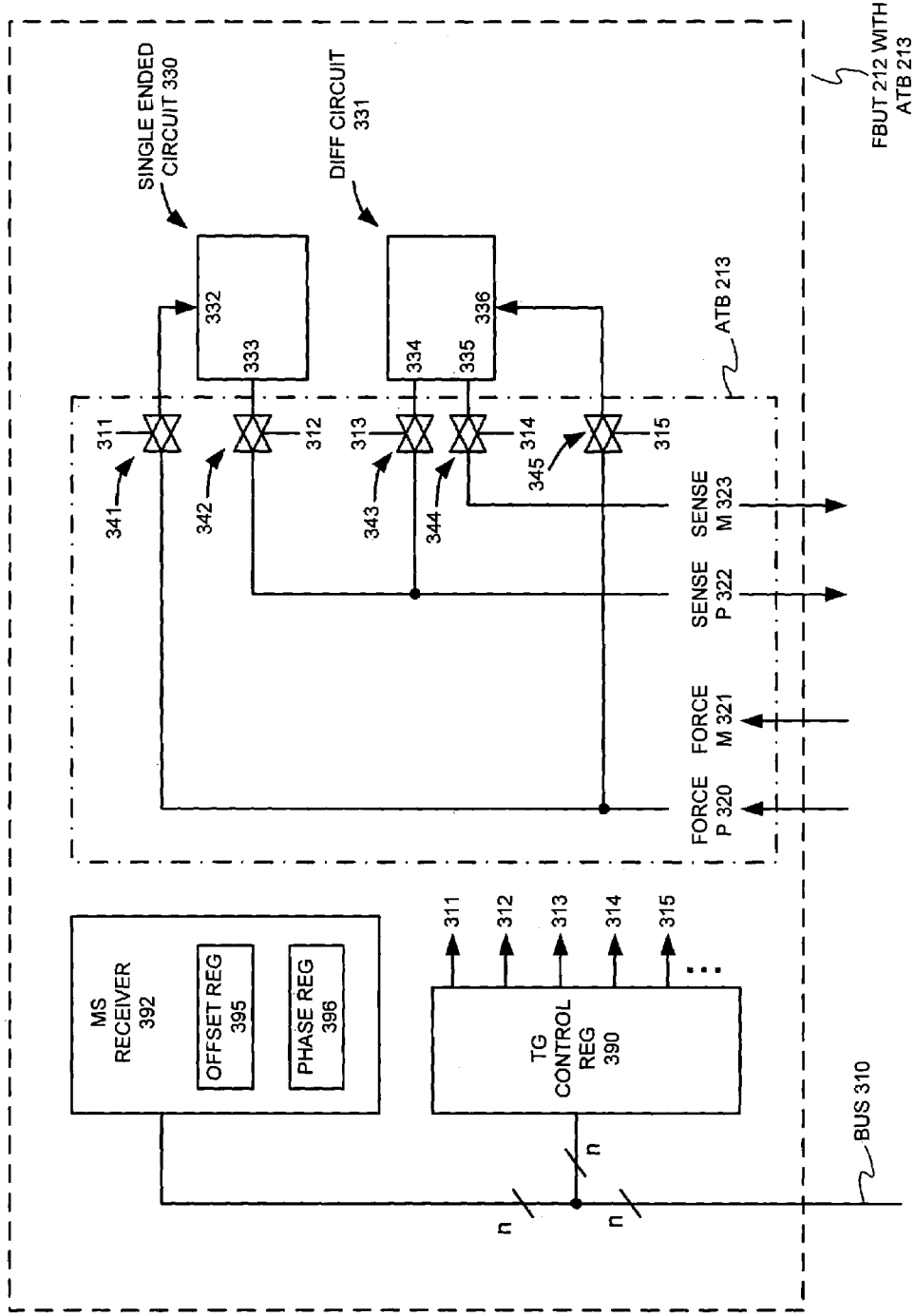
FIG. 3A shows an example FBUT 212 and ATB 213.
Figure 3B:
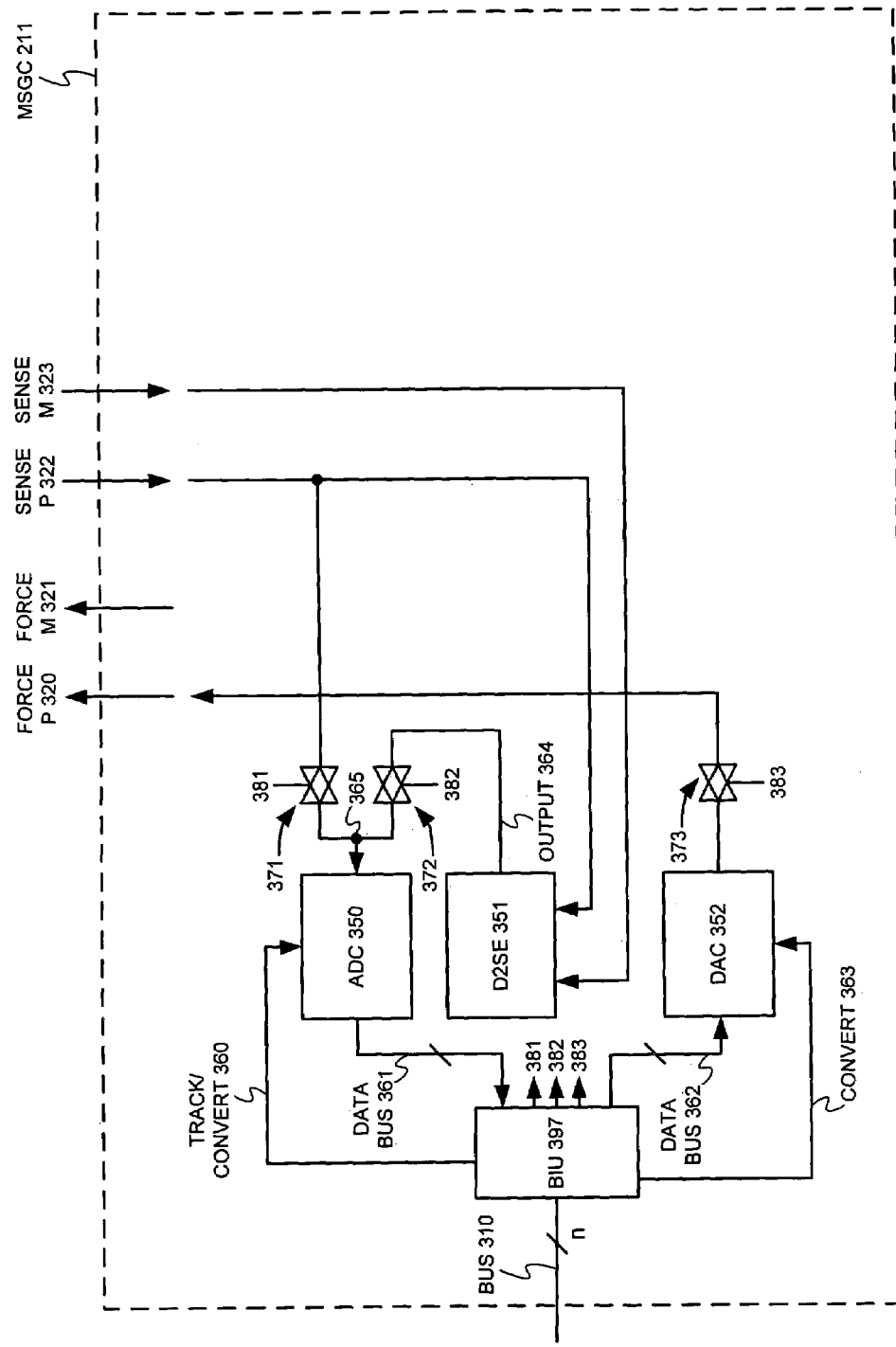
FIG. 3B shows an example MSGC 211.

FIG. 3A shows an example FBUT 212 and ATB 213. FIG. 3B shows an example MSGC 211.

As shown in FIG. 3B, MSGC 211 can couple to bus 310 via a BIU 397. Control and data signals from control system 210 (e.g., track/convert 360, convert 363 and data bus 362) can be applied to MSGC 211 via BIU 397. Data and other feedback signals from MSGC 211 (e.g., data bus 361), can be applied to control system 210 via BIU 397.

Signals applied to force lines 220 can be coupled to appropriate nodes of FBUT 212. Force lines 220 are depicted in FIG. 2 as being comprised of "x" conductors. Such signals can be adjustably routed, to appropriate nodes of FBUT 212, if FBUT 212 includes an ATB 213. Signals from nodes of FBUT 212 can be coupled to sense lines 221. Sense lines 221 are depicted in FIG. 2 as being comprised of "y" conductors. Such signals can be adjustably routed, to sense lines 221, if FBUT 212 includes an ATB 213. Routing by ATB 213 can be controlled by transmission gates (e.g., see transmission gates 341 to 345 of FIG. 3A). The transmission gates can be controlled by a TG control register 390, where register 390 is loaded by control system 210 via bus 310.

The example FBUT 212 of FIG. 3A is comprised of the three following functional blocks that are to be tested. First, a circuit 330 that produces a single-ended analog-domain signal at output 333. Second, a circuit 331 that produces a differential analog-domain signal at outputs 334 and 335. Third, an MS receiver 392 designed for receiving a data signal from another IC.

The example ATB 213 of FIG. 3A is comprised of two force lines and two sense lines. The force lines are: force P 320 and force M 321. The sense lines are: sense P 322 and sense M 323. ATB 213 is further comprised of TGs 341 to 345.

When TGs 343 and 344 are enabled, the differential outputs of circuit 331 are routed to sense P 322 and sense M 323. TGs 343 and 344 can be enabled by, respectively, TG control lines 313 and 314. Differential circuit 331 is shown as also having an analog-domain input 336 that is connected to force P 320 through TG 345. TG 345 can be enabled by TG control line 315.

When TG 342 is enabled, single-ended output 333 of circuit 330 is routed to sense P 322. TG 342 can be enabled by TG control line 312. Single-ended circuit 330 is shown as also having an analog-domain input 332 that is connected to force P 320 through TG 341. TG 341 can be enabled by TG control line 311.

MS receiver 392 includes an offset register 395 and a phase register 396, both of which can be read or loaded via bus 310. Offset register 395 and phase register 396 can be examples of MS digital interface circuits.

An example operation of offset register 395 is as follows. MS receiver 392 can include a comparator for receiving data. Such comparators can have offsets due to manufacturing deviations. MS receiver 392 can include MS circuitry for measuring the amount of offset and for applying a correction signal based upon such offset measurement. The offset measurement, upon which the correction signal is based, can be stored in offset register 395. Such offset register 395 can be read and tested by control system 210 for whether it is within a range.

An example operation of phase register 396 is as follows. MS receiver 392 can include a comparator for receiving data. Such comparators can be clocked according to a recovery clock. MS receiver 392 can include a circuit for measuring the phase of the recovery clock with respect to the data and for accomplishing an adjustment of recovery clock phase based upon such measurement. The resulting phase of the recovery clock can be stored in phase register 396. Such phase register 396 can be read and tested by control system 210 for whether it is within a range.

The example MSGC 211 of FIG. 3B is comprised of three resources: ADC 350, D2SE 351 and DAC 352.

ADC 350 provides a data output to control system 210 on a data bus 361 that connects to BIU 397. ADC 350 is depicted as responding to a track/convert input 360, controlled by control system 210 via BIU 397. Sample input 365 of ADC 350 can be connected to sense P 322 by enabling TG 371. TG 371 is enabled by control system 210 asserting (via BIU 397) control line 381. Sample input 365 of ADC 350 can be connected to output 364 of D2SE 351 by enabling TG 372. TG 372 is enabled by control system 210 asserting (via BIU 397) its control line 382. D2SE 351 is connected to sense P 322 and sense M 323. D2SE 351 converts a differential signal, on sense P 322 and sense M 323, into a single-ended signal on output 364. By enabling TG 342 and TG 371, ADC 350 can be used to measure single-ended output 333 of circuit 330. By enabling TG 343, TG 344 and TG 372, ADC 350 can be used to measure differential outputs 334 and 335 of circuit 331.

DAC 352 accepts a data input from control system 210 on a data bus 362. DAC 352 is depicted as producing an analog domain output signal in response to a convert input 363 controlled by control system 210 (via BIU 397). The analog output of DAC 352 can be connected to force P 320 by enabling TG 373. TG 373 is enabled by control system 210 asserting (via BIU 397) control line 383. By enabling TG 341 and TG 373, DAC 352 can be used to provide an analog-domain signal to input 332 of circuit 330. By enabling TG 345 and TG 373, DAC 352 can be used to provide an analog-domain signal to input 336 of circuit 331.

2. Further Details 2.1.1. Portability

If FBUT 212 is an Si IP core, then ATB 213, control system 210 and MSGC 211 can be included, as a package, with such core. The package is a self-testable unit that can be tested with the same digital test vectors 120, by a DTM, regardless of the particular end-use of the IC in which the package is included.

The intellectual property of the package can be provided on any type computer readable media or memory. Alternatively, the package can be available for download over any type of communications network, when it is encoded as an electromagnetic waveform.

2.1.2. Isolation

While the incorporation of an ATB into an FBUT has advantages for testing purposes, care must be taken, in the design of the ATB, to insure the ATB does not significantly effect the intended operation of the FBUT.

One issue that needs to be addressed in ATB design is isolation. An ATB is effectively linking together nodes of the FBUT that are ordinarily disconnected, except that the ATB's TGs are intended to preserve the isolation of such nodes.

For example, referring to FIG. 3A, force P 320 of ATB 213 connects together nodes 332 and 336. Nodes 332 and 336 are supposed to remain isolated from each other, however, because of TGs 341 and 345. As another example, sense P 322 connects together nodes 333 and 334. Nodes 333 and 334 are supposed to remain isolated from each other, however, because of TGs 342 and 343.

Figure 4:
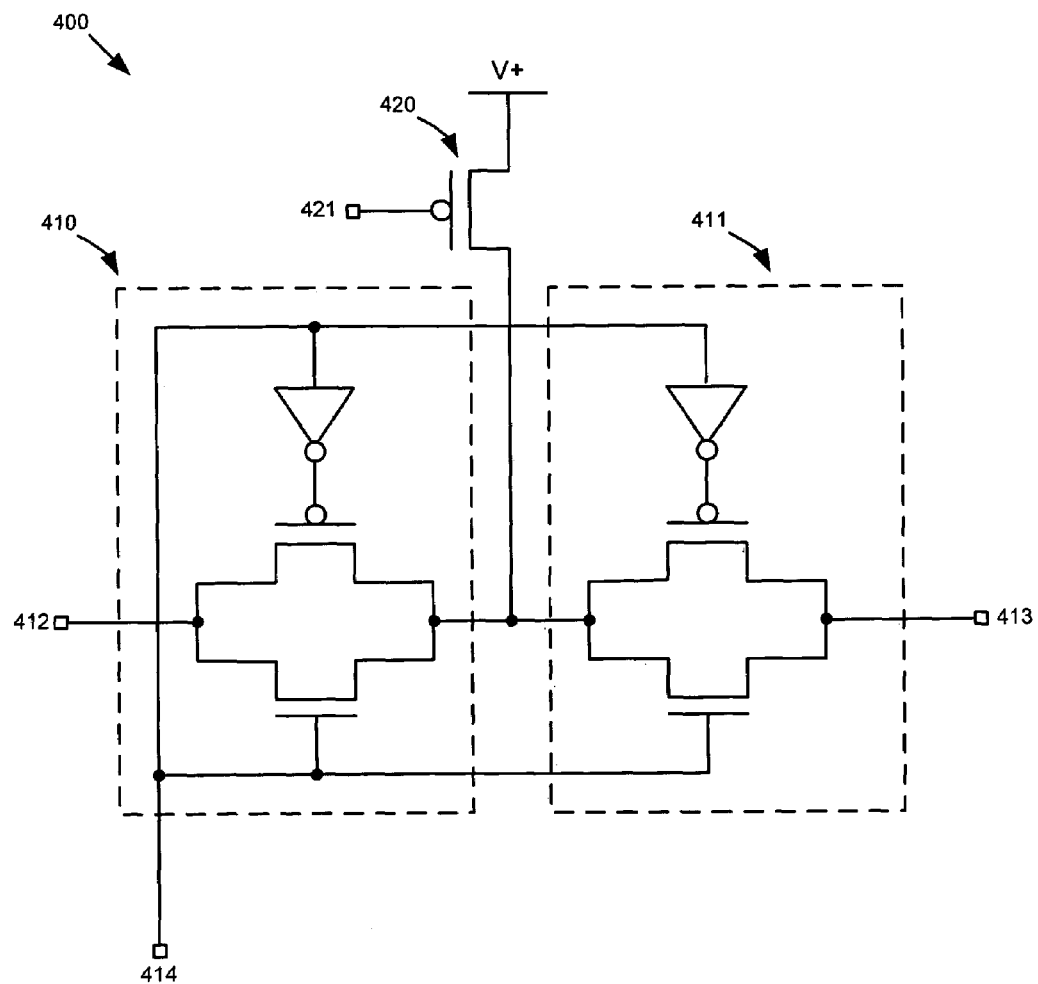
FIG. 4 shows an example TG circuit for reducing leakage currents.

However, even when a TG is turned "off," leakage currents can occur. An example TG circuit, for reducing leakage currents, is shown in FIG. 4. FIG. 4 depicts a TG 400 comprised of two sub-TGs 410 and 411. TG 400 can conduct, between terminals 412 and 413, when control 414 is at V+. TG 400 can be switched to non-conducting when control 414 is at GND. To further promote isolation, between terminals 412 and 413 when control 414 is at GND, a transistor 420 can be switched to conducting by setting node 421 to GND. When it is desired that TG 400 conduct between terminals 412 and 413, transistor 420 can be switched off.

In summary, FIG. 4 presents a TG comprised of two TGs (referred to herein as "sub-TGs"). The controls of the two sub-TGs are connected in parallel and the signal-steering terminals of the two sub-TGs are connected in series. The node by which the two sub-TGs are connected in series can be tied to a particular voltage level (e.g., GND) when it is desired that the TG be in a non-conducting state.

2.1.3. Multiple FBUTs

While FIG. 2 depicts a single FBUT 212 in connection with a control system 210 and an MSGC 211, multiple FBUTs can be tested by a single control system and MSGC. This can occur, for example, where the FBUT is an instance of an Si IP core. If the Si IP core is an interface circuit, for example, it can be desirable to produce multiple instances of such core on an MA DUT.

Figure 5:
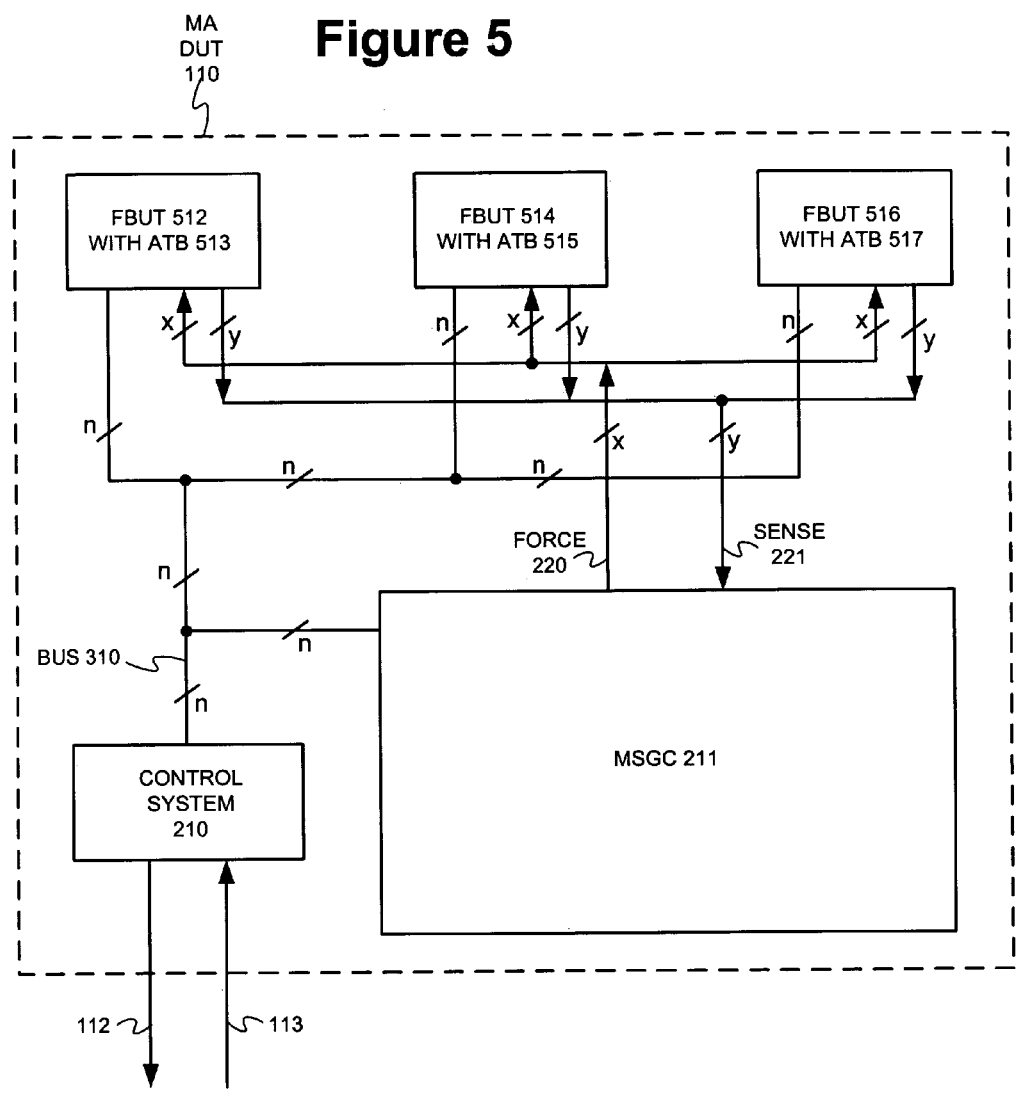
FIG. 5 shows an example of how multiple FBUTs can be tested by a single control system and MSGC.

An example of how multiple FBUTs can be tested by a single control system and MSGC is shown in FIG. 5. The MA DUT 110 of FIG. 5 is the same as the MA DUT 110 of FIG. 2, with the following exceptions.

Rather than having a single FBUT 212 with ATB 213, FIG. 5 shows three instances of an FBUT, referred to as: FBUT 512 with ATB 513, FBUT 514 with ATB 515 and FBUT 516 with ATB 517.

The force inputs, of ATBs 513, 515 and 517, are connected in parallel to force outputs 220 of MSGC 211. The sense outputs, of ATBs 513, 515 and 517, are connected in parallel to sense inputs 221 of MSGC 211.

Bus 310 couples control system 210 to MSGC 211 as well as to the three FBUTs (512, 514, 516) and their ATBs (513, 515, 517).

2.1.4. Example DTM Operation

Figure 6A:
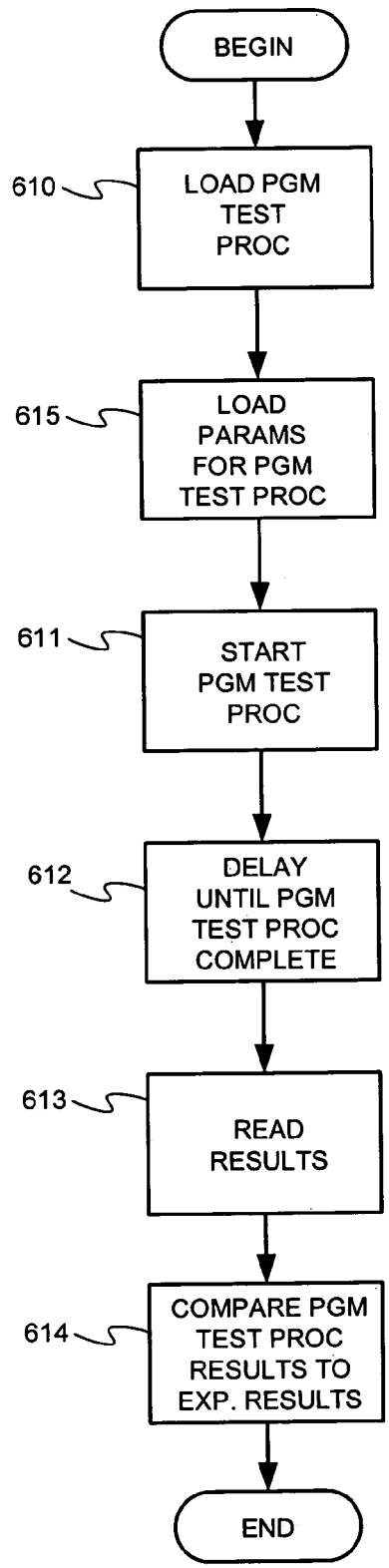
FIGS. 6A and 6B show example operation of a DTM when used to test an MA DUT constructed in accordance with principles of the present invention.

FIG. 6A shows example operation of a DTM when used to test an MA DUT constructed in accordance with the principles of the present invention.

The DTM loads a program test procedure into the memory of a control system 210 of an MA DUT 110 (step 610). In this case, control system 210 can be a uP system.

The DTM loads parameters into the memory of a control system 210 (step 615).

The DTM issues a command that causes control system 210 to begin execution of the program test procedure (step 611).

The program test procedure fully executes during a DTM delay (step 612). Such complete execution can include, for example, comparing one or more results to a set of loaded limits and placing one or more pass/fail flags in a register.

The DTM issues a command (step 613) which causes a read of a pass/fail flag register in the DUT. In an expected vector, bits corresponding to such pass/fail flags have values associated with the expectation of passing; other bits may have no expected value.

The DTM compares the results to an expect vector (step 614).

Figure 6B:
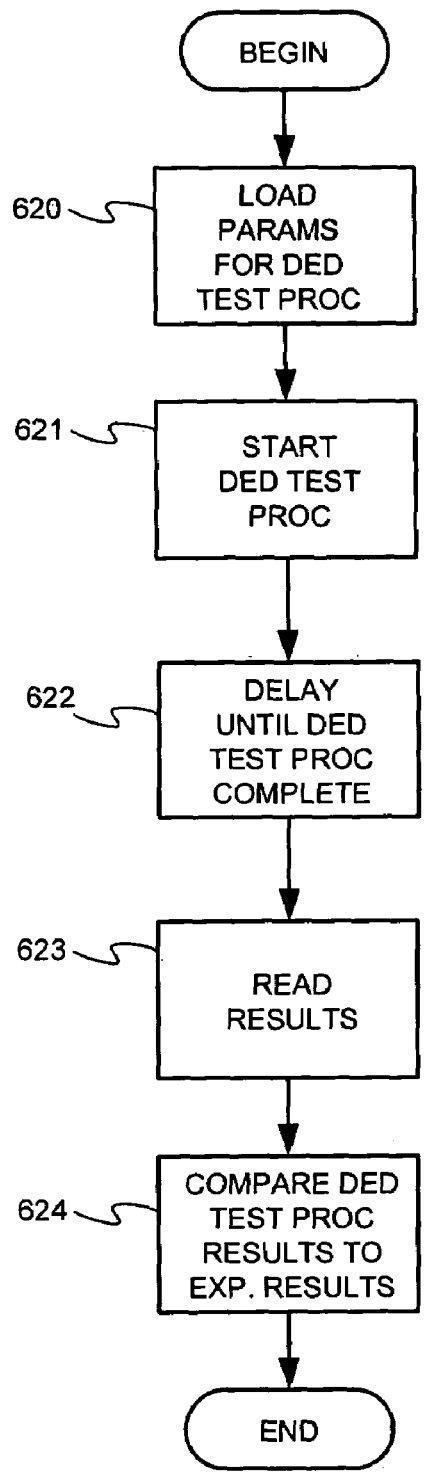

FIG. 6B shows another example operation of a DTM when used to test an MA DUT constructed in accordance with the principles of the present invention.

The DTM loads parameters into the memory of a control system 210 of an MA DUT 110 (step 620). In this case, control system 210 contains at least one dedicated test procedure. A dedicated test procedure can be parameterized.

The DTM issues a command that causes control system 210 to begin execution of the dedicated test procedure (step 621).

The dedicated test procedure fully executes during a DTM delay (step 622). Such complete execution can include, for example, comparing one or more results to a set of loaded limits and placing one or more pass/fail flags in a register.

The DTM issues a command (step 623) which causes a read of a pass/fail flag register in the DUT. In an expected vector, bits corresponding to such pass/fail flags have values associated with the expectation of passing; other bits may have no expected value.

The DTM compares the results to an expected vector (step 624).

2.1.5. Example Program Test Procedure

Figure 7A:
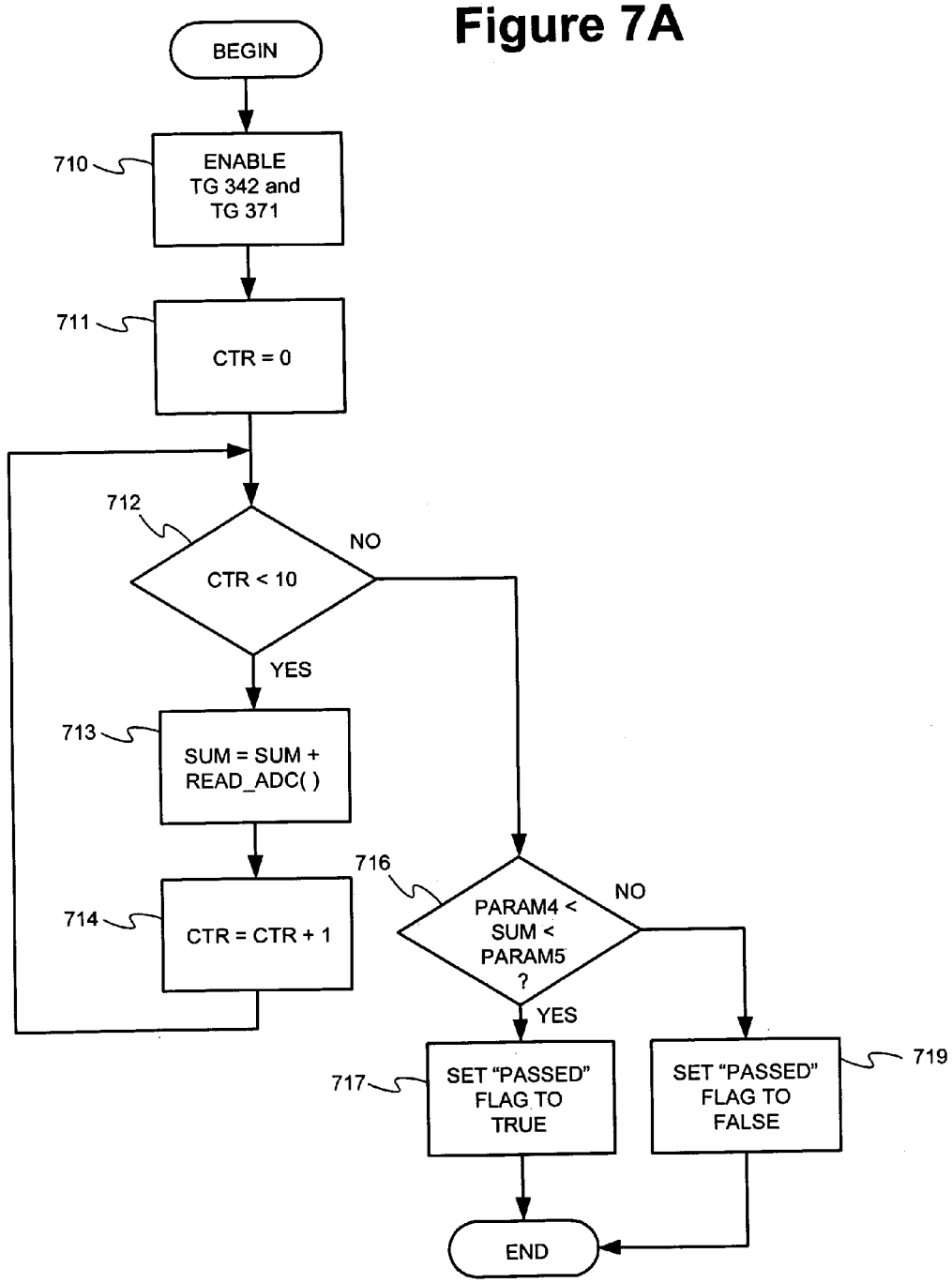

FIG. 7A depicts a flow chart for an example program test procedure, whose digital representation can be loaded, in step 610 of FIG. 6A, into the memory of a control system 210. The program test procedure of FIG. 7A is a parameterized test procedure. The values of PARAM4 and PARAM5 can be loaded, in step 615 of FIG. 6A, into the memory of control system 210.

The example program test procedure of FIG. 7A begins executing after receiving an appropriate start signal, such as that provided by step 611 of FIG. 6A. The program test procedure begins by setting the TGs 342 and 371 (step 710), of FIGS. 3A and 3B, such that output 333 of circuit 330 can be sampled by ADC 350.

A counter ("CTR") is initialized to zero (step 711) and used to cause ten iterations through the loop of steps 712 to 714. Step 712 tests whether CTR is less than ten. Step 713 accumulates, into a variable "SUM," a value as read by ADC 350. In step 713, ADC 350 is read by calling a function "READ_ADC." Step 714 increments CTR.

After 10 samples have been taken, the "no" branch of step 712 is followed.

SUM is then checked for whether it is within the bounds defined by a PARAM4 and a PARAM5 (step 716). If the value of SUM is within bounds, the PASSED flag is set to true (step 717), while otherwise PASSED is set false (step 719).

The PASSED flag and SUM value can interact with a DTM as follows.

FIG. 6A depicts a step 612 that waits until the program test procedure is complete.

FIG. 6A depicts a step 613 that reads the results of the program test procedure. This reading step can correspond to reading out, from an MA DUT, the values of the PASSED flag and the SUM as determined in FIG. 7A. Step 614 of FIG. 6A can correspond to a DTM doing the following with the PASSED flag and SUM value. If PASSED flag is true, the DTM can indicate that the MA DUT is a "good" part. If PASSED flag is false, the DTM can indicate that the MA DUT is a "bad" part and, as part of a log, indicate the test for which the MA DUT failed and the value of SUM corresponding to such failure.

Providing the DTM with a PASSED flag permits it to perform complex checks of an MA DUT by simply comparing MA DUT output vectors to expected vectors. With a conventional MS DUT, an MSTM would be required to execute a relatively complex computer program that includes conditional statements. Compared with simply reading and comparing digital vectors, such an MSTM program can be considerably less portable.

2.1.6. Example Dedicated Test Procedure

Figure 7B:
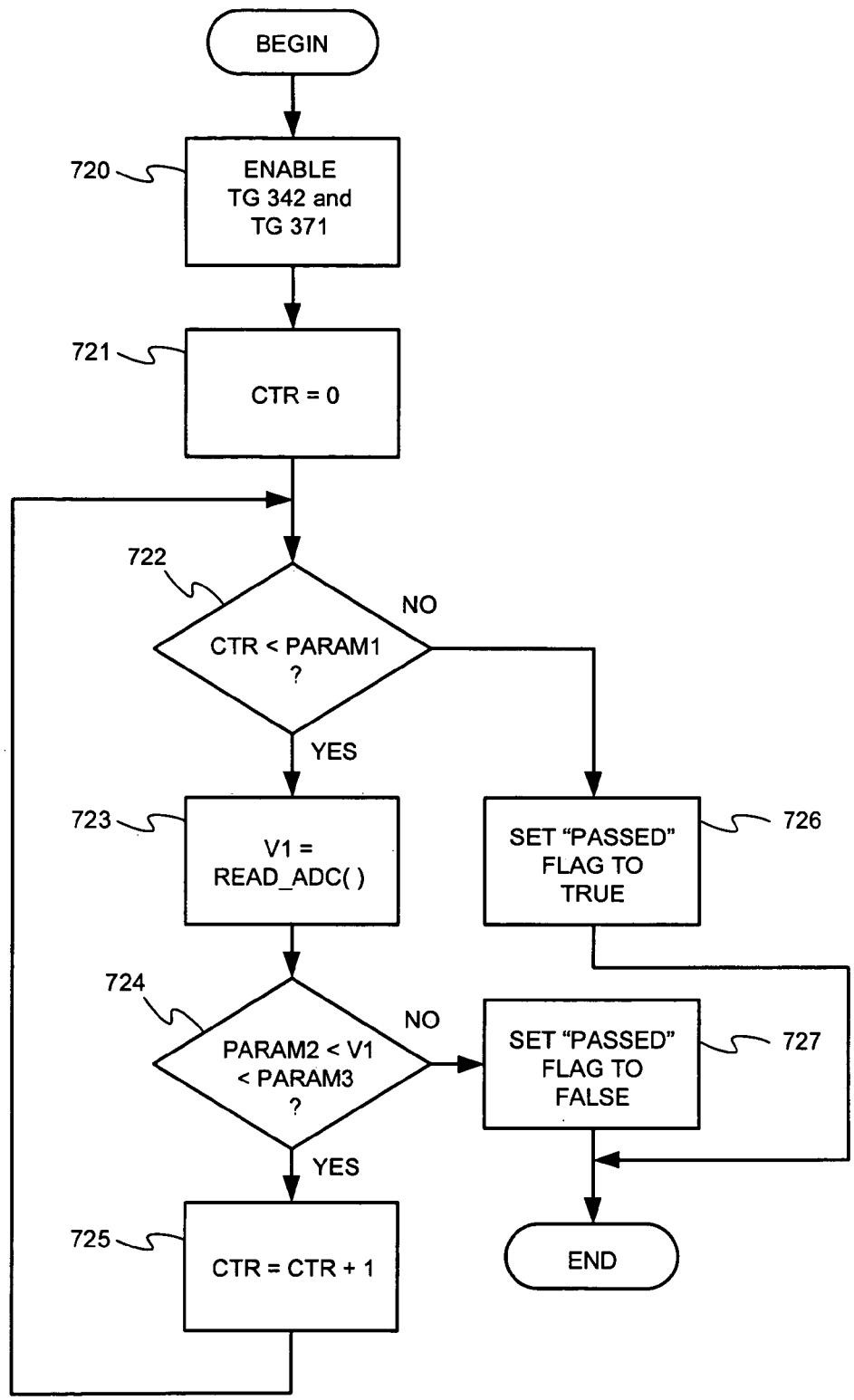
FIG. 7B depicts a flow chart for an example dedicated test procedure.

FIG. 7B depicts a flow chart for an example dedicated test procedure. The dedicated test procedure is parameterized to accept three parameter values. The first parameter is "PARAM1" that is referenced in step 722. The other two parameters are "PARAM2" and "PARAM3" that are referenced in step 724. A digital representation of these parameters can be loaded, in step 620 of FIG. 6B, into the memory of a dedicated control system 210.

The example dedicated test procedure of FIG. 7B begins executing after receiving an appropriate start signal, such as that provided by step 621 of FIG. 6B. The dedicated test procedure begins by setting the TGs 342 and 371 (step 720), of FIGS. 3A and 3B, such that output 333 of circuit 330 can be sampled by ADC 350.

A counter ("CTR") is initialized to zero (step 721) and used to count iterations through the loop of steps 722 to 725. Step 722 tests whether CTR is less than PARAM1. Step 723 stores, in a variable "V1," a value as read by ADC 350. In step 723, ADC 350 is read by calling a function "READ_ADC."

Step 724 tests whether V1 is less than PARAM3 and greater than PARAM2 (i.e., step 724 does a "bounds check" of the ADC measurement). If V1 is within bounds, step 725 increments CTR and another iteration of the loop is started.

If PARAM1 samples have been taken, CTR is no longer less than PARAM1 and step 722 passes control to step 726 that sets a "PASSED" flag to true.

Alternatively, if any value of V1 is not within bounds, control passes to step 727 that sets a "PASSED" flag to false.

The PASSED flag and value of V1 can interact with a DTM as follows.

FIG. 6B depicts a step 622 that waits until the dedicated test procedure is complete.

FIG. 6B depicts a step 623 that reads the results of the test procedure. This reading step can correspond to reading out, from an MA DUT, the values of the PASSED flag and of V1 as determined in accordance with FIG. 7B.

Step 624 of FIG. 6B can correspond to a DTM doing the following with the PASSED flag and V1 value. If PASSED is true, the DTM can indicate that the MA DUT is a "good" part. If PASSED is false, the DTM can indicate that the MA DUT is a "bad" part and, as part of a log, indicate the test for which the MA DUT failed and the value of V1 corresponding to such failure.

As with the above "Example Program Test Procedure," providing the DTM with a PASSED flag permits it, by simply reading MA DUT output vectors and testing for whether such output vectors are the same as expected vectors, to perform a complex check of an MA DUT.

3. Concise Formulations of the Invention

Based upon the foregoing description, and in conjunction with the below Glossary, the following are some concise formulations of the invention.

The invention can be described as first method for testing a mixed-signal or analog functional block of a device-under-test. This first method can comprise the following steps:

receiving, from a test machine, a start signal for a test procedure of a control system, wherein the control system is implemented as an integrated circuit and the functional block under test is integrated on the same, physically contiguous, integrated circuit; and executing the test procedure on the control system to control an analog to digital converter for measuring a node of the functional block under test, wherein the analog to digital converter is integrated on the same, physically contiguous, integrated circuit.

In the above-described first method, the step of executing the test procedure can further comprise the step of numerically evaluating a value from the analog to digital converter. The method described by this paragraph can be referred to as a second method.

In the above-described second method, the step of numerically evaluating can further comprise comparing the value from the analog to digital converter to at least a first limit.

In the above-described second method, the step of numerically evaluating can further comprise setting a flag depending upon a result of the numerical evaluation.

In the above-described second method, the step of numerically evaluating can further comprise providing to the test machine a result of the numerical evaluation.

In the above-described first method, the step of receiving can further comprise the step of receiving a program test procedure into the control system from the test machine.

In the above-described first method, the step of receiving can further comprise the step of receiving a parameter of the test procedure into the control system from the test machine.

In the above-described first method the step of executing a test procedure can further comprise controlling a digital to analog converter for applying a signal to a node of the functional block under test, wherein the digital to analog converter is integrated on the same, physically contiguous, integrated circuit.

In the above-described first method the step of executing a test procedure can further comprise controlling an analog test bus for routing a signal to the analog to digital converter, from a node of the mixed-signal or analog device-under-test, wherein the analog test bus is integrated on the same, physically contiguous, integrated circuit. The method described by this paragraph can be referred to as a third method.

In the above-described third method, the step of executing a test procedure can further comprise controlling the analog test bus, when a transmission gate is to provide isolation, to apply a fixed signal level to a node in-between a first sub-transmission gate and a second sub-transmission gate of the transmission gate.

In the above-described first method, the test machine can be a digital test machine.

In the above-described first method, the functional block under test can be described by an intellectual property package and the package can include designs for the control system and the analog to digital converter.

The invention can be described as a mixed-signal or analog device-under-test that comprises the sub-systems described in the remainder of this paragraph. A functional block under test. An analog to digital converter for measuring a node of the functional block under test. A control system for receiving, from a test machine, a start signal for a test procedure, wherein execution of the test procedure by the control system can cause the analog to digital converter to measure the node. The functional block under test, the analog to digital converter and the control system can all be integrated on the same, physically contiguous, integrated circuit. The invention described by this paragraph can be referred to as a first apparatus, or first integrated circuit, form of the invention.

In the above-described first integrated circuit form of the invention, the control system can further comprise a system for numerically evaluating a value from the analog to digital converter. The invention described by this paragraph can be referred to as a second apparatus, or second integrated circuit, form of the invention.

In the above-described second integrated circuit form of the invention, the system for numerically evaluating can further comprise a system for comparing the value from the analog to digital converter to at least a first limit.

In the above-described second integrated circuit form of the invention, the system for numerically evaluating can further comprise a system for setting a flag depending upon a result of the numerical evaluation.

In the above-described second integrated circuit form of the invention, the system for numerically evaluating can further comprise a system for providing to the test machine a result of the numerical evaluation.

In the above-described first integrated circuit form of the invention, the control system can further comprise systems for receiving into the control system, from the test machine, a program test procedure.

In the above-described first integrated circuit form of the invention, the control system can further comprise systems for receiving into the control system, from the test machine, a parameter of the test procedure.

The above-described first integrated circuit form of the invention can further comprise a digital to analog converter for applying a signal to a node of the functional block under test, wherein the digital to analog converter is integrated on the same, physically contiguous, integrated circuit and execution of the test procedure can further comprise controlling the digital to analog converter to apply a signal to a node of the functional block under test.

The above-described first integrated circuit form of the invention can further comprise an analog test bus, wherein the analog test bus is integrated on the same, physically contiguous, integrated circuit and execution of the test procedure can further comprise controlling the analog test bus to rout a signal to the analog to digital converter from a node of the functional block under test. The invention described by this paragraph can be referred to as a third apparatus, or third integrated circuit, form of the invention.

The above-described third integrated circuit form of the invention, wherein the analog test bus further comprises a transmission gate that has a node in-between a first sub-transmission gate and a second sub-transmission gate. The invention described by this paragraph can be referred to as a fourth apparatus, or fourth integrated circuit, form of the invention.

The above-described fourth integrated circuit form of the invention, wherein the control system, in response to executing the test procedure, can apply a fixed signal level to the node in-between the first sub-transmission gate and the second sub-transmission gate.

The above-described first integrated circuit form of the invention, wherein the test machine, used in conjunction with the integrated circuit, is a digital test machine.

The above-described first integrated circuit form of the invention, wherein the functional block under test, control system and analog to digital converter are products of an intellectual property package.

The invention can be described as a first computer program on a computer usable medium, having computer-readable code devices embodied therein, for determining that, on a single physically contiguous integrated circuit, sub-systems be integrated thereon. The first computer program can comprise the following: computer readable program code devices configured to determine a sub-system that is a functional block under test; computer readable program code devices configured to determine a sub-system that is an analog to digital converter for measuring a node of the functional block under test; and computer readable program code devices configured to determine a sub-system that is a control system for receiving, from a test machine, a test procedure, wherein execution of the test procedure by the control system can cause the analog to digital converter to measure the node.

The above-described first computer program, further comprising: computer readable program code devices configured to determine that the control system can numerically evaluate a value from the analog to digital converter. The invention described by this paragraph can be referred to as a second computer program form of the invention.

The above-described second computer program, further comprising: computer readable program code devices configured to determine that the numerical evaluation compares the value from the analog to digital converter to at least a first limit.

The above-described second computer program, further comprising: computer readable program code devices configured to determine that the numerical evaluation sets a flag depending upon a result of the numerical evaluation.

The above-described second computer program, further comprising: computer readable program code devices configured to determine that a result of the numerical evaluation is provided to the test machine.

The above-described first computer program, further comprising: computer readable program code devices configured to determine that the control system can load into the control system, from the test machine, a program test procedure.

The above-described first computer program, further comprising: computer readable program code devices configured to determine that the control system can load into the control system, from the test machine, a parameter of the test procedure.

The above-described first computer program, further comprising: computer readable program code devices configured to determine a sub-system that is an digital to analog converter for applying a signal to a node of the functional block under test, wherein the digital to analog converter is integrated on the same, physically contiguous, integrated circuit and execution of the test procedure can further comprise controlling the digital to analog converter to apply a signal to a node of the functional block under test.

The above-described first computer program, further comprising: computer readable program code devices configured to determine a sub-system that is an analog test bus, wherein the analog test bus is integrated on the same, physically contiguous, integrated circuit and execution of the test procedure can further comprise controlling the analog test bus to rout a signal to the analog to digital converter from a node of the functional block under test. The invention described by this paragraph can be referred to as a third computer program form of the invention.

The above-described third computer program, further comprising: computer readable program code devices configured to determine that the analog test bus comprises a transmission gate with a node in-between a first sub-transmission gate and a second sub-transmission gate. The invention described by this paragraph can be referred to as a fourth computer program form of the invention.

The above-described fourth computer program, further comprising: computer readable program code devices configured to determine that the control system, in response to executing the test procedure, can apply a fixed signal level to the node in-between the first sub-transmission gate and the second sub-transmission gate.

The above-described first computer program, wherein the computer readable program code devices configured to determine the functional block under test, control system and analog to digital converter sub-systems are a portable intellectual property package.

The invention can be described as fourth method for testing a mixed-signal functional block of a device-under-test. This fourth method can comprise the following three steps:

receiving, from a test machine, a start signal for a test procedure of a control system, wherein the control system is implemented as an integrated circuit and the functional block under test is integrated on the same, physically contiguous, integrated circuit;

executing the test procedure on the control system such that a transfer of data, between the control system and a mixed-signal digital interface circuit of the functional block under test, occurs; and executing the test procedure on the control system such that a test, of data obtained from the functional block under test, occurs.

The above-described fourth method, wherein the transfer of data is a reading of a value, of the mixed-signal digital interface circuit, for processing by the control system.

The above-described fourth method, wherein the transfer of data is a writing of a value, to the mixed-signal digital interface circuit, by the control system.

The invention can be described as mixed-signal device-under-test that comprises the sub-systems described in the remainder of this paragraph. A functional block under test, integrated on an integrated circuit. A mixed-signal digital interface circuit of the functional block undertest. A control system, integrated on the same physically contiguous integrated circuit, for receiving, from a test machine, a start signal for a test procedure, wherein execution of the test procedure by the control system can cause a transfer of data between the control system and the mixed-signal digital interface circuit. The invention described by this paragraph can be referred to as a fifth apparatus, or fifth integrated circuit, form of the invention.

The above-described fifth integrated circuit form of the invention, wherein the transfer of data is a reading of a value, of the mixed-signal digital interface circuit, for processing by the control system.

The above-described fifth integrated circuit form of the invention, wherein the transfer of data is a writing of a value, to the mixed-signal digital interface circuit, by the control system.

The invention can be described as a fifth computer program on a computer usable medium, having computer-readable code devices embodied therein, for determining that, on a single physically contiguous integrated circuit, sub-systems be integrated thereon. The fifth computer program can comprise the following: computer readable program code devices configured to determine a sub-system that is a functional block under test; computer readable program code devices configured to determine a sub-system that is a mixed-signal digital interface circuit of the functional block under test; and computer readable program code devices configured to determine a sub-system that is a control system for receiving, from a test machine, a start signal for a test procedure, wherein execution of the test procedure by the control system can cause a transfer of data between the control system and the mixed-signal digital interface circuit.

The above-described fifth computer program, further comprising: computer readable program code devices configured to determine that the transfer of data is a reading of a value, of the mixed-signal digital interface circuit, for processing by the control system.

The above-described fifth computer program, further comprising: computer readable program code devices configured to determine that the transfer of data is a writing of a value, to the mixed-signal digital interface circuit, by the control system.

4. Glossary of Selected Terms

ADC: Analog to Digital Converter. "ADC" is defined herein to refer to any converter that can convert any analog domain signal into a digital value.

Analog circuit: A circuit that operates with analog domain signals.

Analog domain signals: signals whose levels are not intended to be limited to digital signal levels. Analog signals are also known as continuous signals.

Analog signal source: a source of analog domain signals.

ATB: Analog Test Bus.

BIU: Bus Interface Unit.

Computer program: instructions for a data processing system, where such instructions can be: stored in a memory, stored on computer-readable media or transferred over a network when encoded in an electromagnetic wave.

DAC: Digital to Analog Converter. "DAC" is defined herein to refer to any digitally controllable analog signal source.

Dedicated test procedure (or MS dedicated test procedure): A test procedure implemented, in whole or in part, with dedicated hardware. Dedicated hardware includes, but is not limited to, a general computer system whose program memory is fixed during the time when a TM, operating in testing mode, is interacting with the computer system. A dedicated test procedure can be implemented with dedicated hardware that is integrated on the same MA DUT tested by the dedicated test procedure.

Digital circuit: A circuit that operates with digital domain signals.

Digital domain signals: signals intended to be limited to discrete levels.

DSP: Digital Signal Processing.

DTM: Digital TM. A TM for testing digital DUTs, such as ASICs.

DUT: Device Under Test. As used herein, DUT refers to a single, physically contiguous, IC that is subject to testing by a TM.

FBUT: Functional Block Under Test. Refers to a portion of a DUT that is tested by a test procedure. An FBUT, as defined herein, comprises either an MS circuit or an all analog circuit. The portion of the DUT tested can be defined in terms of hardware as in, for example, a section of circuitry tested by a test procedure. The portion tested can also be defined functionally.

FFT: Fast-Fourier Transform.

IC: Integrated Circuit.

Intellectual property or IP: IP is defined herein to refer to any computer-readable design for an IC.

MA DUT: Mixed-signal or Analog DUT. A DUT upon which is integrated at least one FBUT.

MS: Mixed Signal.

MS circuit: Processes signals by having digital and analog circuits working together. The interaction, between the digital and analog portions of an MS circuit, can comprise a feedback loop.

MS digital interface circuit: A digital portion, of an MS circuit "x," that provides an interface between MS circuit x and other circuits. An MS digital interface circuit can be characterized by having no single value indicative of correct operation, but can assume a range of values.

MSGC: Mixed Signal Generate and Capture.

MS IC: An IC that comprises at least one MS circuit.

MSTM: MS TM. A TM intended for testing MS ICs.

Parameterized test procedure: A test procedure constructed to accept one or more parameters that can alter its operation.

Program test procedure: A test procedure implemented as a computer program. The computer program can be stored in a memory of a data processing system. The memory need not be fixed during the time when a TM, operating in testing mode, is interacting with the data processing system. The data processing system, on which the computer program is executed, can be integrated on the same MA DUT tested by the program test procedure.

Si IP: Silicon IP. Refers to IC designs that are intended for sale to multiple customers.

Test procedure (or MS test procedure): A procedure for conducting tests of an FBUT. A test procedure can be implemented as a computer program, or it can be implemented, in whole or in-part, with dedicated hardware. A test procedure can produce numerical values representative of measurements of the FBUT or useful for providing stimulus to the FBUT. A test procedure can perform algorithms useful for evaluating the results of a test. For example, a test procedure can produce a flag, or other indication, of whether an FBUT has "passed" the test procedure. In order to accomplish its goals, a test procedure can perform numerical algorithms. The numerical algorithms can be used in processing data captured by an MSGC (e.g., with a resource such as an ADC), or can be used in causing the MSGC to generate signals to the FBUT (e.g., using a resource such as a DAC). A test procedure can also operate by accomplishing a transfer of data, to or from, an MS digital interface circuit.

TG: Transmission Gate. A TG can be either complementary or of a single transistor type. For example, a complementary TG can be comprised of both N and P channel MOSFETs.

TM: Test Machine.

uP: microprocessor.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A method for testing a mixed-signal or analog functional block of a device-under-test, comprising:

receiving, from a test machine, a start signal for a test procedure of a control system, wherein the control system is implemented as an integrated circuit and the functional block under test is integrated on the same, physically contiguous, integrated circuit; and executing the test procedure on the control system to control an analog to digital converter for measuring a node of the functional block under test, wherein the analog to digital converter is integrated on the same, physically contiguous, integrated circuit.

2. The method of claim 1, wherein the step of executing the test procedure further comprises:

numerically evaluating a value from the analog to digital converter.

3. The method of claim 2, wherein the step of numerically evaluating further comprises:

comparing the value from the analog to digital converter to at least a first limit.

4. The method of claim 2, wherein the step of numerically evaluating further comprises:

setting a flag depending upon a result of the numerical evaluation.

5. The method of claim 2, further comprising:

providing to the test machine a result of the numerical evaluation.

6. The method of claim 1, wherein the step of receiving further comprises:

receiving a program test procedure into the control system from the test machine.

7. The method of claim 1, wherein the step of receiving further comprises:

receiving a parameter of the test procedure into the control system from the test machine.

8. The method of claim 1, wherein the step of executing a test procedure can further comprise controlling a digital to analog converter for applying a signal to a node of the functional block under test, wherein the digital to analog converter is integrated on the same, physically contiguous, integrated circuit.

9. The method of claim 1, wherein the step of executing a test procedure can further comprise controlling an analog test bus for routing a signal to the analog to digital converter, from a node of the mixed-signal or analog device-under-test, wherein the analog test bus is integrated on the same, physically contiguous, integrated circuit.

10. The method of claim 9, wherein the step of executing a test procedure can further comprise controlling the analog test bus, when a transmission gate is to provide isolation, to apply a fixed signal level to a node in-between a first sub-transmission gate and a second sub-transmission gate of the transmission gate.

11. The method of claim 1, wherein the test machine is a digital test machine.

12. The method of claim 1, wherein the functional block under test is described by an intellectual property package and the package includes designs for the control system and the analog to digital converter.

* * * * *